United States Patent
Tanaka et al.

(10) Patent No.: US 7,817,522 B2
(45) Date of Patent: Oct. 19, 2010

(54) RECORDING CLOCK GENERATION APPARATUS

(75) Inventors: Kiyotaka Tanaka, Hirakata (JP); Hironori Deguchi, Hirakata (JP)

(73) Assignee: Panasonic Corporation, Osaka (JP)

( * ) Notice: Subject to any disclaimer, the term of this patent is extended or adjusted under 35 U.S.C. 154(b) by 682 days.

(21) Appl. No.: 10/564,288

(22) PCT Filed: Sep. 29, 2004

(86) PCT No.: PCT/JP2004/014669

§ 371 (c)(1),
(2), (4) Date: Jan. 11, 2006

(87) PCT Pub. No.: WO2005/031742

PCT Pub. Date: Apr. 7, 2005

(65) Prior Publication Data

US 2006/0176796 A1 Aug. 10, 2006

(30) Foreign Application Priority Data

Sep. 29, 2003 (JP) ............................ 2003-338103

(51) Int. Cl.
*G11B 5/09* (2006.01)

(52) U.S. Cl. .............. 369/59.19; 369/47.28; 369/47.1

(58) Field of Classification Search ............... 369/47.1, 369/47.28, 47.3, 47.48, 53.22, 59.19, 112.01, 369/47.22, 47.27
See application file for complete search history.

(56) References Cited

U.S. PATENT DOCUMENTS

| 2004/0052181 | A1* | 3/2004 | Tada et al. | ............... 369/53.22 |
| 2004/0190408 | A1 | 9/2004 | Shiraishi et al. | |

FOREIGN PATENT DOCUMENTS

| JP | 5-268081 | 10/1993 |
| JP | 2000-149459 | 5/2000 |
| JP | 2003-7004 | 1/2003 |
| JP | 2003-100015 | 4/2003 |
| JP | 2003-123257 | 4/2003 |
| JP | 2004-246948 | 9/2004 |

* cited by examiner

Primary Examiner—Hoa T Nguyen
Assistant Examiner—Kim-Kwok Chu
(74) Attorney, Agent, or Firm—Wenderoth, Lind & Ponack, L.L.P.

(57) ABSTRACT

There is provided an optical disc recording apparatus containing a small-area circuit that is adaptable to both of the formats of DVD-R/RW and +RW/+R standards.

The apparatus is provided with a circuit (106) for converting a 32T-cycle binarized wobble signal based on the +RW/+R standard into a 186T-cycle binarized wobble signal based on the DVD-R/RW standard, and the converted 186T-cycle binarized wobble signal is selected with a selector (108) during +RW/+R recording while the 186T-cycle binarized wobble signal is selected during DVD-R/RW recording, whereby subsequent PLL circuits are shared to reduce the circuit scale.

7 Claims, 8 Drawing Sheets

RECORDING CLOCK GENERATION APPARATUS

TECHNICAL FIELD

The present invention relates to a recording clock generation apparatus and, more particularly, to sharing of a wobble PLL circuit and a physical address data decoding circuit in an apparatus adaptable to both of DVD-R/RW recording and DVD+RW/+R recording.

BACKGROUND ART

A conventional DVD-R/RW and DVD+RW/+R recorder is constituted as shown in FIG. 6. This apparatus is provided with both of a 186-multiply wobble PLL circuit and a 32-multiply wobble PLL circuit. Usually, address information, additional information, and a sync signal are recorded on these types of recording media to specify recording positions (tracks) on optical discs even when no data are recorded on the optical discs. As a method for modulating the above-mentioned address information and additional information, a format called "Land Pre-pit" (hereinafter also referred to as "LPP") is employed for the DVD-R/RW while a format called "Address In Pre-groove" (hereinafter also referred to as "ADIP") is employed for the DVD+RW/+R.

In the figure, reference numeral 601 denotes a wobble signal, which is input to a time domain filter 602 for noise removal. The signal from which noise is removed by the time domain filter 602 is input to a subsequent wobble period averaging circuit 603, wherein variations in the cycle of the signal are averaged.

A phase correction circuit 614 performs phase compensation by correcting a timing error in the recorded data with respect to the ADIP signal, which timing error is caused by the cycle of the ADIP signal being converted, and either the LPP signal or the ADIP signal outputted through a timing conversion circuit 616 is selected by a selector 615 to be input to the phase compensation circuit 614.

A phase comparator 604 compares the phase of the output from the wobble period averaging circuit 603 with the phase of the output from a selector 612. Reference numeral 605 denotes a charge pump for digital-to-analog converting the output of the phase comparator 604 in order to control a VCO (Voltage-Controlled Oscillator) which is a subsequent analog circuit. Reference numeral 606 denotes a selector for supplying the output of the charge pump 605 to either of a VCO (Voltage-Controlled Oscillator) 607 or a VCO 608.

Reference numeral 609 denotes a selector for selecting either the output of the VOC 607 or the output of the VOC 608, and supplying the selected signal to an arithmetic circuit 613 described later, 610 denotes a 1/186 frequency divider, 611 denotes a 1/32 frequency divider, and 612 denotes a selector for selecting either the output of the 1/186 frequency divider 610 or the output of the 1/32 frequency divider 611, and outputting the selected signal. Further, reference numeral 613 denotes an arithmetic circuit for performing frequency-division of a reference clock, detection of PLL lock/unlock, detection of frequency error, detection of phase inversion, and the like.

Further, reference numeral 617 denotes an LPP decoder for decoding a binarized LPP signal to output address data, and 618 denotes an ADIP decoder for decoding a binarized ADIP signal to output address data. Further, reference numeral 691 denotes a selector for selecting either the output of the LPP decoder 617 or the output of the ADIP decoder 618, and outputting the selected signal as address data.

In the above-mentioned construction, when the input signal is a land pre-pit signal based on the DVD-R/RW, the selector 606 outputs the input signal to the VCO (607), and the output of the 1/186 frequency-divider 610 is selected by the selector 612 to be output to the phase comparator 604, and further, a deviation from the reference clock is calculated by the arithmetic circuit 613, thereby outputting a signal WPLLOK 615 indicating that the PLL circuit is locked, and a recording clock frequency OK signal WREFOK 616.

As described above, there is a multi-optical-disc-compatible recorder which can perform recording and playback in/from the above-mentioned plural optical discs by providing a means for converting address information that is detected from the binarized wobble signal based on the DVD+RW/+R standard into a land pre-pit signal based on the DVD-R/RW standard (for example, refer to Japanese Published Patent Application No. 2003-100015 and Japanese Published Patent Application No. 2003-123257). This apparatus detects the address information from the binarized wobble signal, and converts the address information which also concerns the cycle of the binarized wobble signal into a land pre-pit signal based on the DVD-R/RW standard, thereby realizing cycle protection between the two sync signals to avoid destruction of the recorded data due to recording of data into a wrong position on the disc.

The recording clock generation apparatus of the conventional DVD-R/RW and DVD+RW/+R recorder is constructed as described above, and contains the PLL circuits corresponding to the formats of the DVD-R/RW standard and the DVD+RW/+R standard, respectively. Therefore, the circuit scale of the apparatus is undesirably increased, which is disadvantageous in terms of cost.

Further, the means for converting the binarized wobble signal based on the DVD+RW/+R standard into the land pre-pit signal based on the DVD-R/RW standard, which is aimed at sync protection, complicates the structure of the conversion circuit.

The present invention is made to solve the above-mentioned problems and has for its object to provide a recording clock generation apparatus to be used in a DVD-R/RW and DVD+RW/+R recorder, which is compatible to the respective formats of the DVD-R/RW standard and the DVD+RW/+R standard, and avoids an increase in the circuit scale.

DISCLOSURE OF THE INVENTION

According to a first aspect of the present invention, there is provided a recording clock generation apparatus for generating a recording clock to be used when performing recording on plural media based on different standards of frequencies at recording using the same recorder, and the apparatus comprises a frequency conversion circuit for converting an inputted 32T-cycle binarized wobble signal based on a DVD+RW/+R standard into a 186T-cycle binarized wobble signal based on a DVD-R/RW standard; a selector for selecting either the converted 186T-cycle binarized wobble signal that is outputted from the frequency conversion circuit or the inputted 186T-cycle binarized wobble signal, and outputting the selected signal; and a PLL circuit for 186-multiplying the binarized wobble signal on receipt of the output of the selector.

According to a second aspect the present invention, there is provided a recording clock generation apparatus for generating a recording clock to be used when performing recording on plural media based on different standards of frequencies at recording using the same recorder, and the apparatus comprises a frequency conversion circuit for converting an inputted 186T-cycle binarized wobble signal based on a DVD-R/RW standard into a 32T-cycle binarized wobble signal based on a DVD+RW/+R standard; a selector for selecting either the converted 32T-cycle binarized wobble signal that is outputted from the frequency conversion circuit or the inputted 32T-cycle binarized wobble signal, and outputting the selected signal; and a PLL circuit for 32-multiplying the binarized wobble signal on receipt of the output of the selector.

According to a third aspect of the present invention, the recording clock generation apparatus of the first aspect of the present invention further includes a physical address data decoder comprising a circuit for converting a binarized ADIP signal based on the DVD+RW/+R standard into a binarized land pre-pit signal based on the DVD-R/RW standard, and a circuit for detecting even sync data, odd sync data, 0 data, and 1 data from the binarized land pre-pit signal.

According to a fourth aspect the present invention, the recording clock generation apparatus of the second aspect of the present invention further includes a physical address data decoder comprising a circuit for converting a binarized land pre-pit signal based on the DVD-R/RW standard into a binarized ADIP signal based on the DVD+RW/+R standard, and a circuit for detecting sync data, 0 data, and 1 data from the binarized ADIP signal.

According to a fifth aspect of the present invention, the recording clock generation apparatus of the first aspect further includes a circuit for converting a binarized ADIP signal based on the DVD+RW/+R standard into a binarized land pre-pit signal based on the DVD-R/RW standard; and a phase adjustment circuit for performing phase adjustment between the 186T-cycle binarized wobble signal and the binarized land pre-pit signal which are based on the DVD-R/RW standard.

According to a sixth aspect of the present invention, the recording clock generation apparatus of the second aspect further includes a circuit for converting a binarized land pre-pit signal based on the DVD-R/RW standard into a binarized ADIP signal based on DVD+RW/+R standard; and a phase adjustment circuit for performing phase adjustment between the 32T-cycle binarized wobble signal and the binarized ADIP signal which are based on the DVD+RW/+R standard.

According to a seventh aspect of the present invention, there is provided a recording clock generation apparatus for generating a recording clock to be used when performing recording on plural media based on different standards of frequencies at recording using the same recorder, and the apparatus comprises a frequency conversion circuit for converting an inputted first cycle binarized wobble signal based on a first standard into a second cycle binarized wobble signal based on a second standard; a selector for selecting either the second cycle binarized wobble signal that is outputted from the frequency conversion circuit or an inputted second cycle binarized wobble signal, and outputting the selected signal; and a PLL circuit for multiplying the binarized wobble signal to change its cycle from the wobble cycle to the cycle of the recording clock, on receipt of the output of the selector.

According to the first aspect of the present invention, a recording clock generation apparatus for generating a recording clock to be used when performing recording on plural media based on different standards of frequencies at recording using the same recorder, comprises a frequency conversion circuit for converting an inputted 32T-cycle binarized wobble signal based on a +RW/+R standard into a 186T-cycle binarized wobble signal based on a DVD-R/RW standard; a selector for selecting either the converted 186T-cycle binarized wobble signal that is outputted from the frequency conversion circuit or the inputted 186T-cycle binarized wobble signal, and outputting the selected signal; and a PLL circuit for 186-multiplying the binarized wobble signal on receipt of the output of the selector. Therefore, circuits in subsequent stages can be shared by inputting, to the subsequent circuits, the converted 186T-cycle binarized wobble signal during DVD-R/RW recording and the 186T-cycle binarized wobble signal during DVD+RW/+R recording, resulting in reductions in circuit scale and production cost.

Further, according to the second aspect of the present invention, a recording clock generation apparatus for generating a recording clock to be used when performing recording on plural media based on different standards of frequencies at recording using the same recorder, comprises a frequency conversion circuit for converting an inputted 186T-cycle binarized wobble signal based on a DVD-R/RW standard into a 32T-cycle binarized wobble signal based on a DVD+RW/+R standard; a selector for selecting either the converted 32T-cycle binarized wobble signal that is outputted from the frequency conversion circuit or the inputted 32T-cycle binarized wobble signal, and outputting the selected signal; and a PLL circuit for 32-multiplying the binarized wobble signal on receipt of the output of the selector. Therefore, circuits in subsequent stages can be shared by inputting, to the subsequent circuits, the converted 32T-cycle binarized wobble signal during DVD-R/RW recording and the 32T-cycle binarized wobble signal during DVD+RW/+R recording, resulting in reductions in circuit scale and production cost.

Further, according to the third aspect of the present invention, the recording clock generation apparatus of the first aspect includes a physical address data decoder comprising a circuit for converting a binarized ADIP signal based on the DVD+RW/+R standard into a binarized land pre-pit signal based on the DVD-R/RW standard, and a circuit for detecting even sync data, odd sync data, 0 data, and 1 data from the binarized land pre-pit signal. Therefore, subsequent circuits from an LPP decoding circuit can be shared by inputting, to the subsequent circuits, the converted binarized land pre-pit signal during DVD+RW/+R recording and the binarized land pre-pit signal during DVD-R/RW recording. Further, since the data of the binarized ADIP signal is converted directly into the binarized land pre-pit signal, the conversion circuit is not complicated, resulting in reductions in circuit scale and production cost.

Further, according to the fourth aspect of the present invention, the recording clock generation apparatus of the second aspect includes a physical address data decoder comprising a circuit for converting a binarized land pre-pit signal based on the DVD-R/RW standard into a binarized ADIP signal based on the DVD+RW/+R standard, and a circuit for detecting sync data, 0 data, and 1 data from the binarized ADIP signal. Therefore, subsequent circuits from an ADIP decoding circuit can be shared by inputting, to the subsequent circuits, the converted binarized land pre-pit signal during DVD-R/RW recording and the binarized land pre-pit signal during DVD+RW/+R recording. Further, since the data of the binarized LPP signal is converted directly into the binarized ADIP signal, the conversion circuit is not complicated, resulting in reductions in circuit scale and production cost.

Further, according to the fifth aspect of the present invention, the recording clock generation apparatus of the first aspect includes a circuit for converting a binarized ADIP signal based on the DVD+RW/+R standard into a binarized land pre-pit signal based on the DVD-R/RW standard; and a phase adjustment circuit for performing phase adjustment between the 186T-cycle binarized wobble signal and the binarized land pre-pit signal which are based on the DVD-R/RW standard. Therefore, the position adjustment circuit for the recorded data and the binarized land pre-pit signal can be shared by performing phase compensation by correcting a timing error in the recorded data with respect to the land pre-pit signal due to conversion of the cycle thereof, resulting in a reduction in circuit scale.

Further, according to the sixth aspect of the present invention, the recording clock generation apparatus of the second aspect includes a circuit for converting a binarized land pre-pit signal based on the DVD-R/RW standard into a binarized ADIP signal based on DVD+RW/+R standard; and a phase adjustment circuit for performing phase adjustment between the 32T-cycle binarized wobble signal and the binarized ADIP signal which are based on the +RW/+R standard. Therefore, the position adjustment circuit for the recorded data and the binarized ADIP signal can be shared by performing phase compensation by correcting a timing error in the recorded data with respect to the ADIP signal due to conversion of the cycle thereof, resulting in a reduction in circuit scale.

Further, according to the seventh aspect of the present invention, a recording clock generation apparatus for generating a recording clock to be used when performing recording on plural media based on different standards of frequencies at recording using the same recorder, comprises a frequency conversion circuit for converting an inputted first cycle binarized wobble signal based on a first standard into a second cycle binarized wobble signal based on a second standard; a selector for selecting either the second cycle binarized wobble signal that is outputted from the frequency conversion circuit or an inputted second cycle binarized wobble signal, and outputting the selected signal; and a PLL circuit for multiplying the binarized wobble signal to change its cycle from the wobble cycle to the cycle of the recording clock, on receipt of the output of the selector. Therefore, circuits in subsequent stages can be shared by inputting, for example, a converted 186T-cycle binarized wobble signal during DVD-R/RW recording while inputting a 186T-cycle binarized wobble signal during +RW/+R recording, to the subsequent circuits, resulting in reductions in circuit scale and production cost.

BEST MODE TO EXECUTE THE INVENTION

Embodiment 1

Hereinafter, a recording clock generation apparatus used in a DVD-R/RW or DVD+RW/+R recorder according to a first embodiment of the present invention will be described with reference to the drawings.

Figure 1:
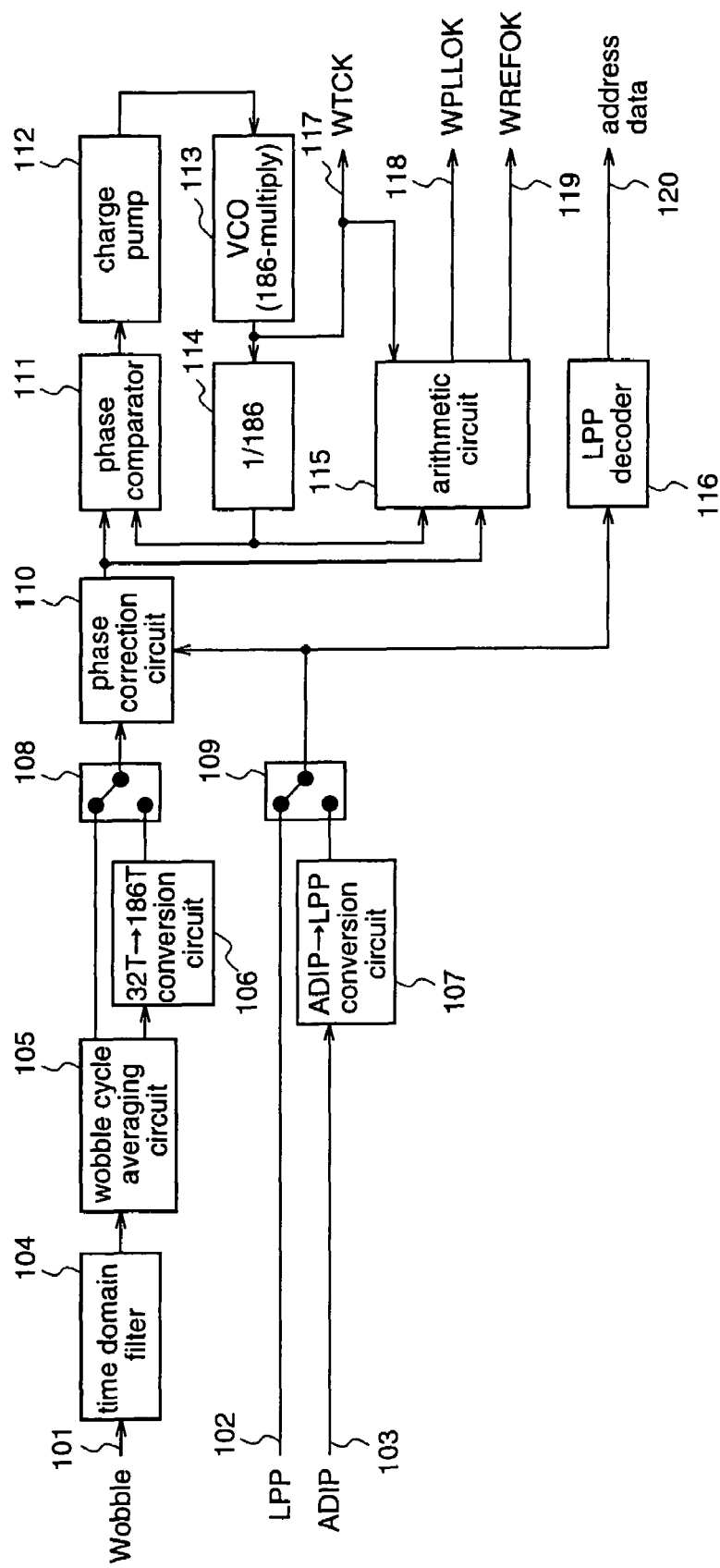
FIG. 1 is a block diagram illustrating a recording clock generation apparatus according to a first embodiment of the present invention.

With reference to FIG. 1, 104 denotes a time domain filter for removing noise from an inputted binarized signal; 105 denotes a wobble cycle averaging circuit for averaging the cycle of the binarized signal outputted from the time domain filter 104; 106 denotes a 32T→186T conversion circuit for converting the output of the wobble cycle averaging circuit 105 into a 186T-cycle binarized wobble signal; 108 denotes a selector for selecting either the output of the wobble cycle averaging circuit 105 or the output of the 32T→186T conversion circuit 106, and outputting the selected signal; and 110 denotes a phase correction circuit for correcting the phase of the binarized wobble signal outputted from the selector 108.

Further, 111 denotes a phase comparator for comparing the phase of the output of the phase correction circuit 110 with the phase of the output signal of a $\frac{1}{186}$ frequency divider 114 which is described later; 112 denotes a charge pump for digital-to-analog converting the output of the phase comparator 111 to control a 186 frequency multiply VCO (Voltage Controlled Oscillator) as a subsequent analog circuit; 114 denotes a $\frac{1}{186}$ frequency divider for reconstructing a 186-multiplied output 1T cycle recording clock WTCK 117; and 115 denotes an arithmetic circuit for performing processings such as division of a reference clock, detection of PLL lock/unlock, detection of frequency error, and detection of phase inversion.

Furthermore, 102 denotes a binarized land pre-pit signal to be used during DVD-R/RW recording; 103 denotes a binarized ADIP (address in pre-groove) signal to be used during +RW/+R recording; 107 denotes an ADIP→LPP conversion circuit for converting the binarized ADIP signal 103 into a binarized land pre-pit signal; 109 denotes a selector for selecting either the binarized LPP signal 102 or the converted binarized LPP signal outputted from the ADIP→LPP conversion circuit 107, and outputting the selected signal; and 116 denotes an LPP decoder for decoding the binarized LPP signal outputted from the selector 109, and outputting the decoded signal as address data 120. The address data 120 include even sync data, odd sync data, 0 data and 1 data.

Next, the operation will be described. Since the fundamental operation as a PLL circuit is identical to that of the conventional apparatus, only the characteristic operation of the present invention will be mainly described hereinafter. A 186T-cycle binarized wobble signal is inputted as an input wobble 101 during DVD-R/RW recording, while a 32T-cycle binarized wobble signal is inputted as an input wobble 101 during DVD+RW/+R recording. The selector 108 selects the output of the wobble cycle averaging circuit 105 during DVD-R/RW recording based on the LPP format standard, and the selector 108 selects the output of the circuit 106 which converts the 32T-cycle binarized wobble signal into the 186T-cycle binarized wobble signal during DVD+RW/+R recording based on the ADIP format standard, thereby sharing the subsequent PLL circuits (111~116).

Figure 2:
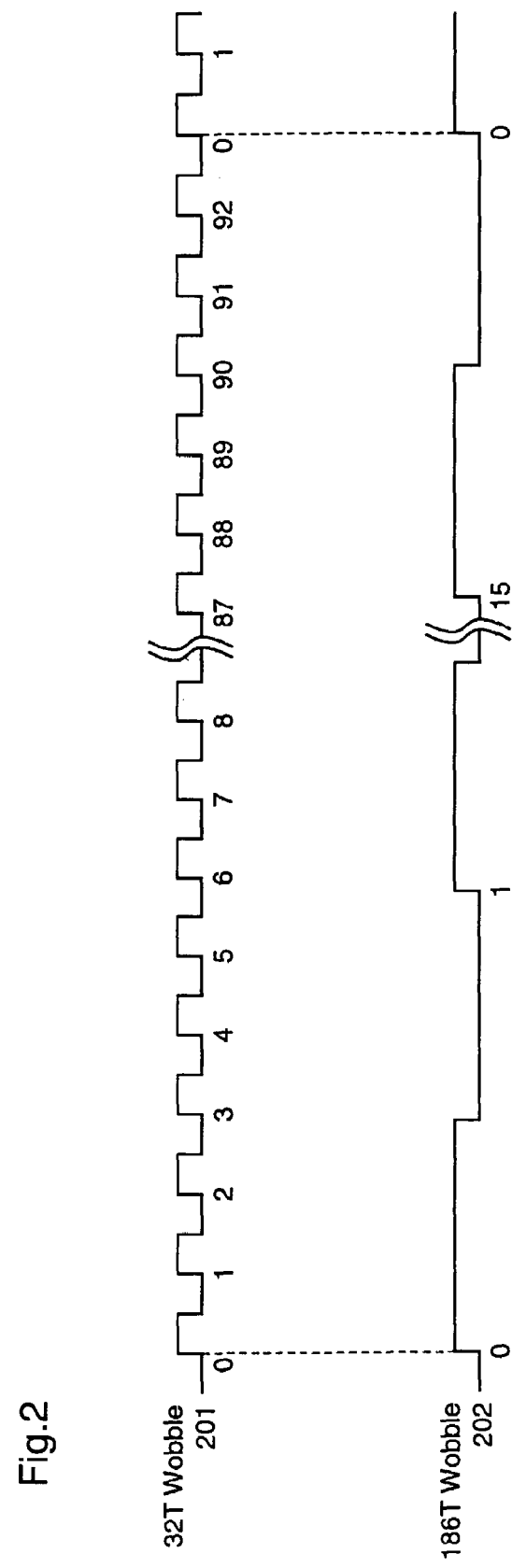
FIG. 2 is a diagram illustrating waveforms of a conversion circuit from a 32T-cycle binarized wobble signal to a 186T-cycle binarized wobble signal, which signals are shown in FIG. 1.

In this first embodiment, only a single system comprising a VCO and a frequency divider for DVD-R/RW is needed to make the apparatus adaptable to different formats. The circuit 106 for converting a 32T-cycle binarized wobble signal into a 186T-cycle binarized wobble signal converts, as shown in FIG. 2, a 32T-cycle binarized wobble signal 201 into a 186T-cycle binarized wobble signal 202.

Figure 8A:
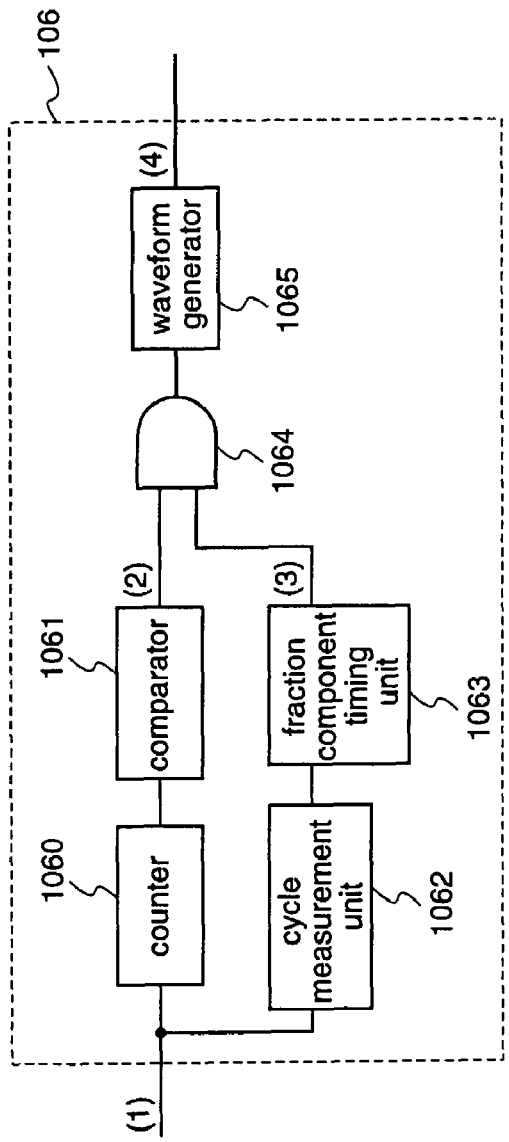
FIG. 8(a) is a block diagram illustrating the specific construction of a 32T→186T conversion circuit 106.

FIG. 8(a) is a block diagram illustrating the specific construction of the 32T→186T conversion circuit 106. Further, FIG. 8(b) is a diagram illustrating clock waveforms at the respective parts of the circuit shown in FIG. 8(a).

Figure 8B:
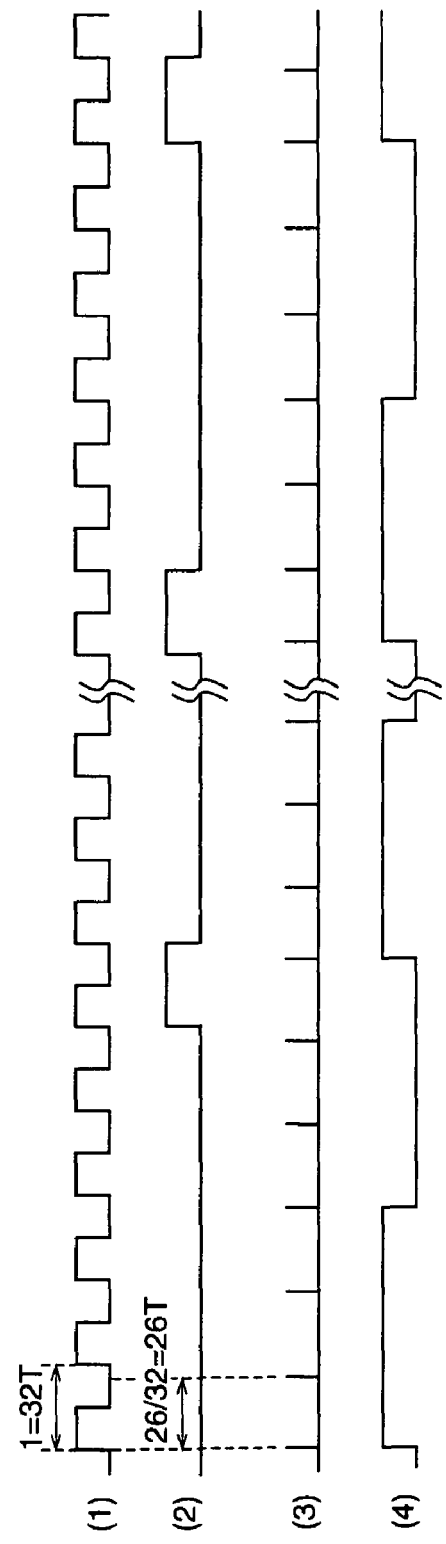
FIG. 8(b) is a diagram illustrating clock waveforms in the respective components of the circuit shown in FIG. 8(a).

A clock of 36T shown in the uppermost line of FIG. 8(b) passes through a counter 1060 and a comparator 1061 to be outputted as a timing waveform indicating the number of 32T wobbles (integer parts) obtained when converting the clock from 32T to 186T as shown in the second line. Since 32T multiplied by 5.8125 is 186T, a rising timing of 186T occurs during a period from the [5.8125×n]th 32T to the ([5.8125× n]+1)th 32T ([ ] is a Gauss notation indicating a decimal cut-off value, and n is a positive integer).

Further, the third line of FIG. 8(b) shows an output waveform of the 32T wobble signal which has passed through a cycle measurement unit 1062 and a fraction component timing unit 1063, and the timing is delayed by a length (5.8125× n−[5.8125×n]) times as long as the cycle of the 32T wobble signal during a period from the [5.8125×n]th integer part to the ([5.8125×n]+1)th integer part of the 32T wobble signal in the first line.

The lowermost line of FIG. 8(b) shows a 186T signal outputted from a waveform generator 1065 after the output of the comparator 1061 and the output of the fraction component timing unit 1063 are ORed (AND circuit 1064).

Figure 3:
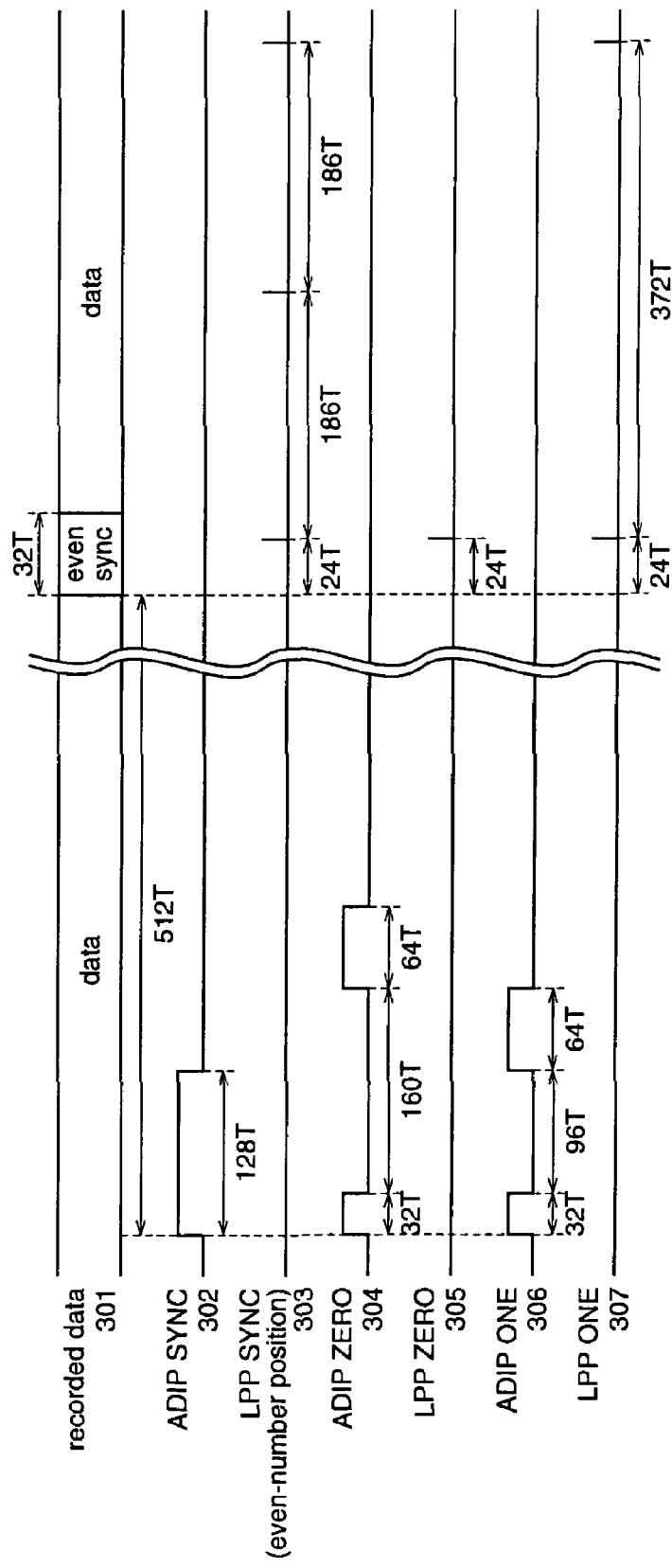
FIG. 3 is a diagram illustrating waveforms of a conversion circuit from an ADIP signal to a land pre-pit signal, which signals are shown in FIG. 1.

In FIG. 1, the binarized land pre-pit signal 102 is supplied during DVD-R/RW recording while the binarized ADIP signal 103 is supplied during +RW/+R recording. The selector 109 selects the binarized land pre-pit signal 102 during the DVD-R/RW recording, and selects the converted binarized land pre-pit signal 102 that is obtained by converting the binarized ADIP signal thereto during the DVD+RW/+R recording, whereby the land pre-pit decoder 116 and the following circuits can be shared. However, processing such as error correction of the address data 120 to be performed during the DVD-R/RW recording is different from that to be performed during the DVD+RW/+R recording. The ADIP→LPP circuit 107 for converting a binarized ADIP signal into a binarized land pre-pit signal performs conversion of an ADIP sync signal 302 into a land pre-pit sync even position signal 303 shown in FIG. 3, conversion of an ADIP 0 signal 304 into a land pre-pit 0 signal 305 shown in FIG. 3, and conversion of an ADIP 1 signal 306 into a land pre-pit 1 signal 307 shown in FIG. 3.

Further, since the selectors 108 and 109 perform selection of output signals as described above during the DVD-R/RW or DVD+RW/+R recording, the phase correction circuit 110 can be shared.

Figure 4:
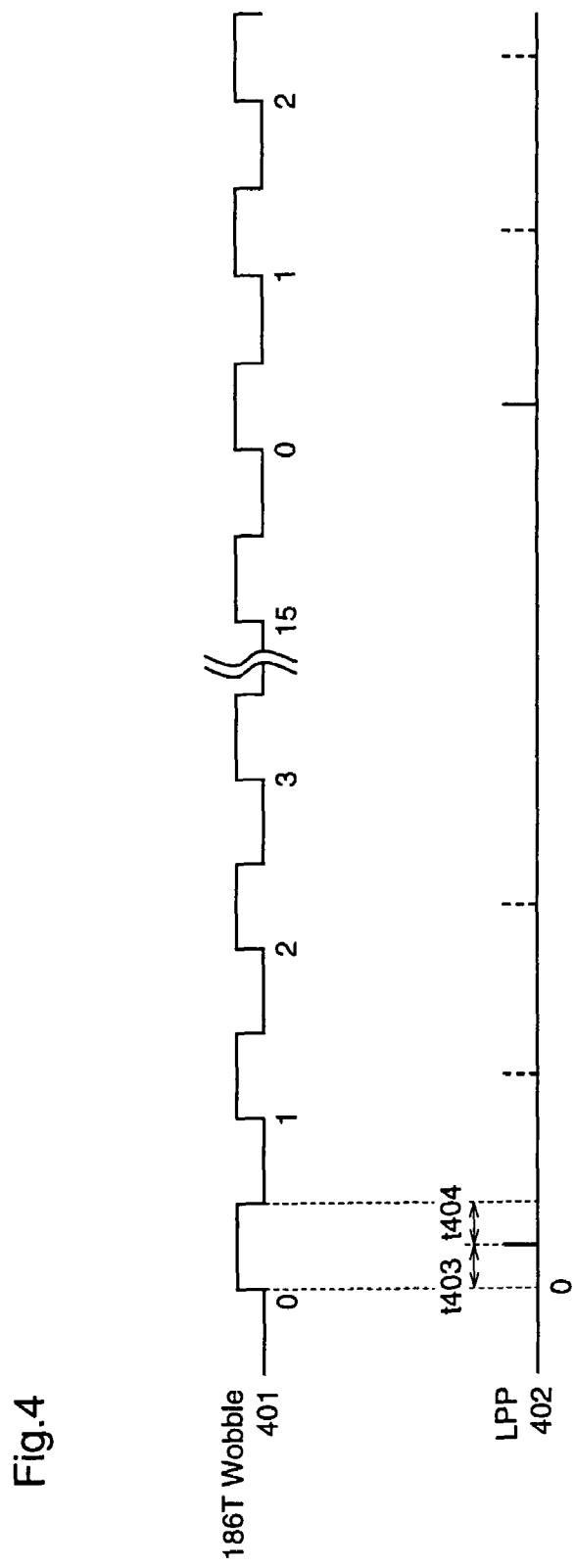
FIG. 4 is a diagram illustrating waveforms of phase correction shown in FIG. 1.

The binarized wobble signal 101 which has passed through the time domain filter 104 and the wobble cycle averaging circuit 106 has a propagation delay with respect to the land pre-pit signal 102, and the phase correction circuit 110 performs phase adjustment on the 186T-cycle binarized wobble signal 401 and the binarized land pre-pit signal 402 shown in FIG. 4. Further, the phase adjustment is carried out so that the time t403 becomes equal to the time t404.

Figure 5:
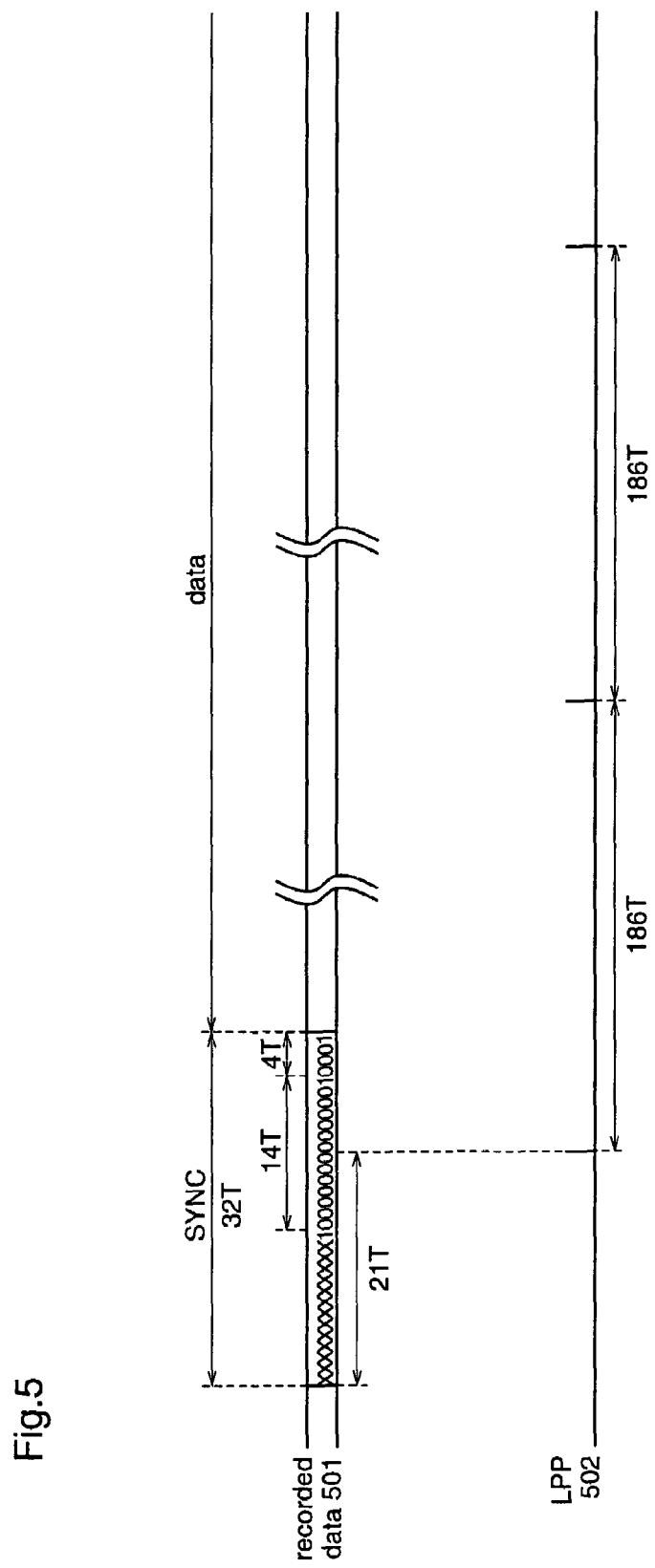
FIG. 5 is a diagram illustrating waveforms of position adjustment between recorded data of a DVD recorder and a land pre-pit signal.
Figure 6:
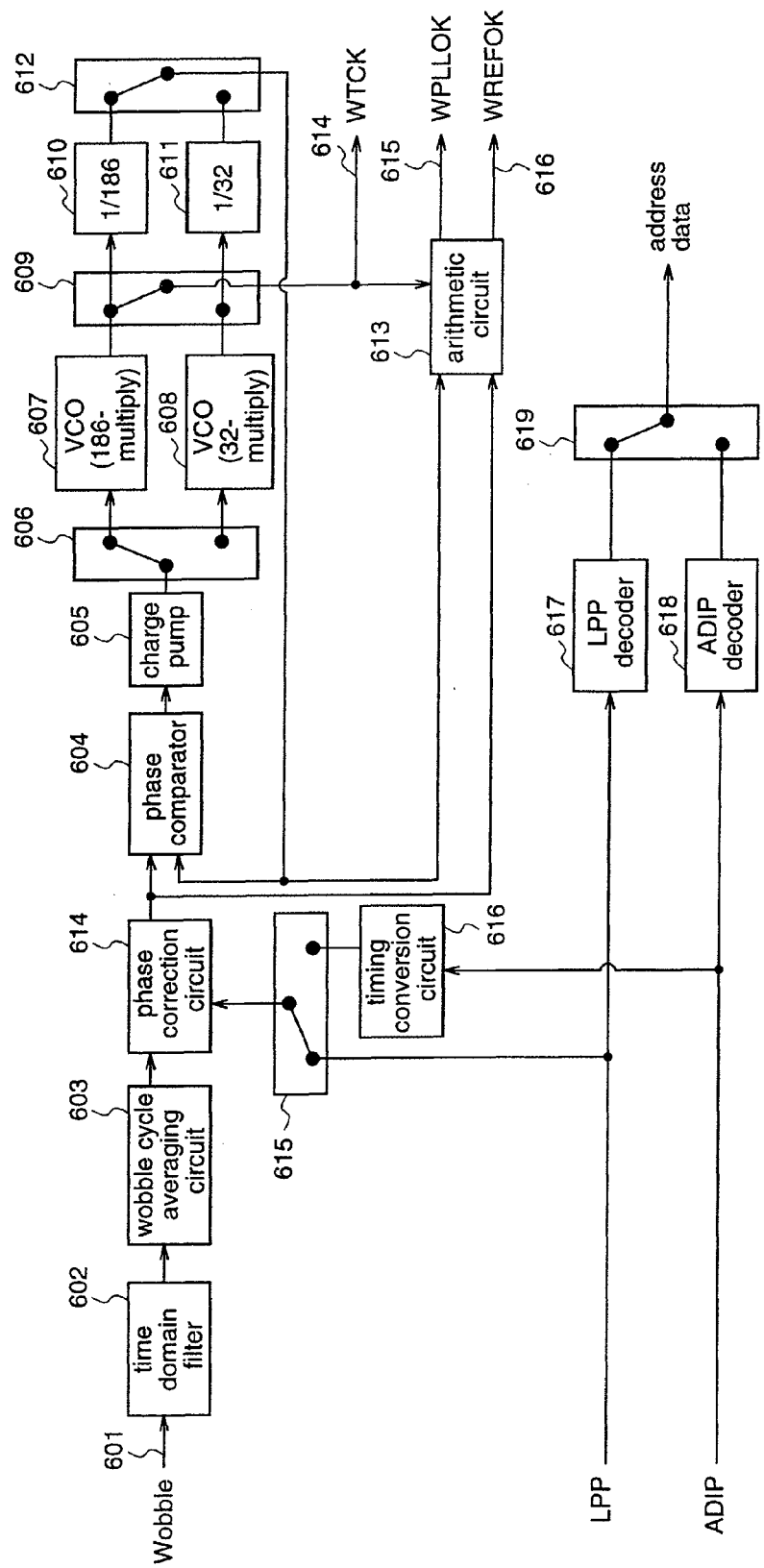
FIG. 6 is a block diagram illustrating the construction of the conventional recording clock generation apparatus.

Further, a description will be given of the output waveform of the phase correction circuit 110 when the above-mentioned recording clock generation apparatus is incorporated in a DVD recorder. With reference to FIG. 5, a binarized land pre-pit signal 502 is a binarized land pre-pit signal during the DVD-R/RW recording while it is a signal obtained by converting the binarized ADIP signal thereto during the DVD+RW/+R recording. Position adjustment of the binarized land pre-pit signal 502 is carried out by adjusting the position of the recorded data 501 according to the position of the binarized land pre-pit signal 502.

As described above, the recording clock generation apparatus of the DVD-R/RW and DVD+RW/+R recorder according to the first embodiment is provided with the circuit 106 for converting a 32T-cycle binarized wobble signal based on the DVD+RW/+R standard into a 186T-cycle binarized wobble signal based on the DVD-R/RW standard. As for the 32T-cycle binarized wobble signal, it is converted into a 186T-cycle binarized wobble signal and then inputted to the subsequent 186 frequency multiply wobble PLL circuit. Therefore, the components corresponding to the 32 frequency multiply wobble PLL circuit are dispensed with in the PLL circuit, and thereby the VCO that occupies a large area is deleted, resulting in a recorder which can deal with media corresponding to the two standards of DVD-R/RW and DVD+RW/+R by sharing the 186 frequency multiply wobble PLL circuit based on the DVD-R/RW standard.

Further, the recording clock generation apparatus is provided with the ADIP→LPP conversion circuit 107 and the selector 109, and the converted binarized land pre-pit signal is inputted to the subsequent circuits from the LPP decoding circuit during the DVD+RW/+R recording while the binarized land pre-pit signal is inputted thereto during the DVD-R/RW recording, and therefore, the subsequent circuits from the LPP decoding circuit can be shared. Further, since the data of the binarized ADIP signal is converted directly into the binarized land pre-pit signal, the conversion circuit is not complicated, resulting in reduced circuit area and reduced production cost.

Furthermore, since the output of the ADIP→LPP conversion circuit 107 is input to the phase correction circuit 110, the position adjustment circuit for the recorded data and the binarized land pre-pit signal can be shared, resulting in reduced circuit scale.

Figure 7:
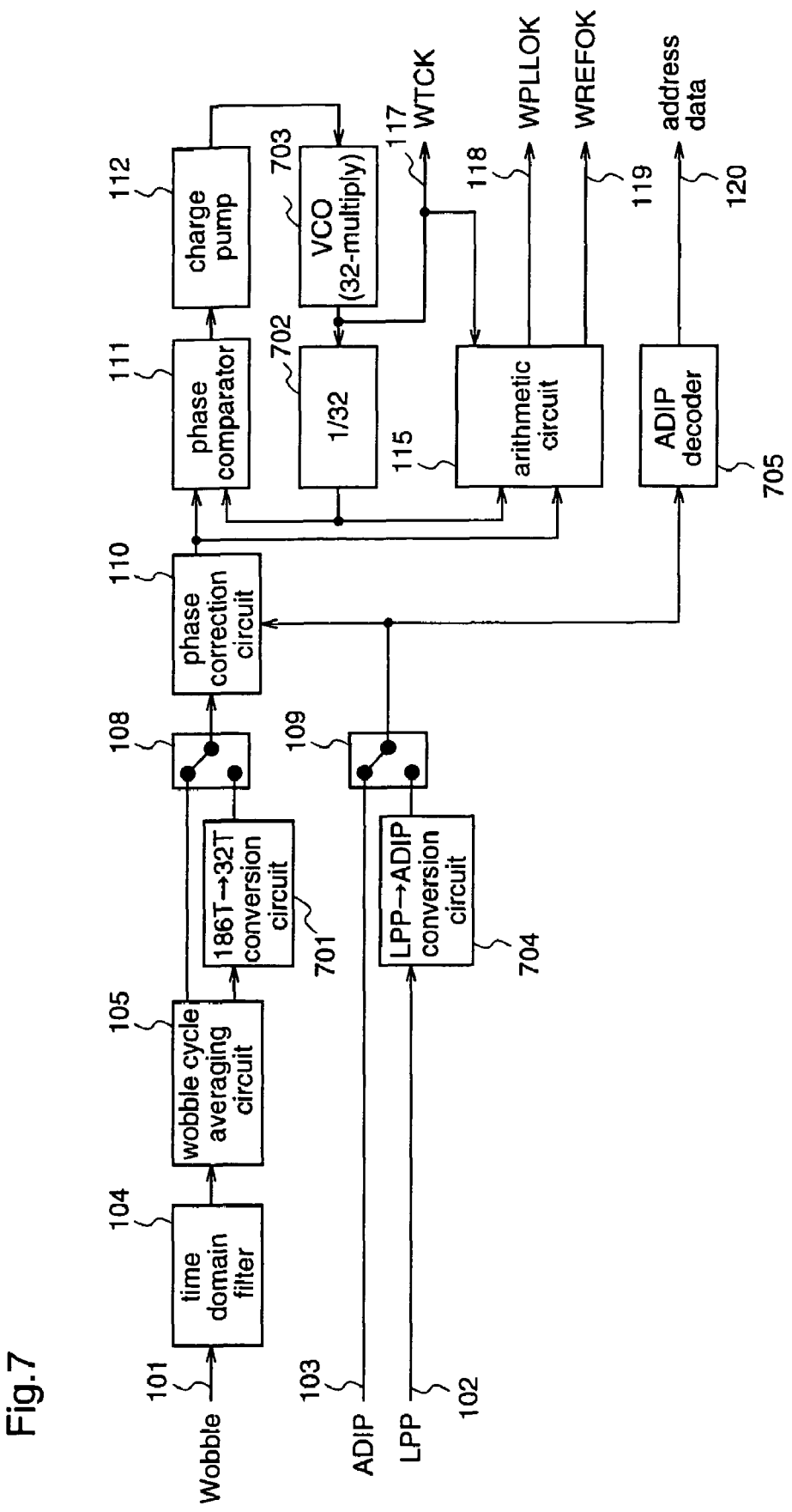
FIG. 7 is a block diagram illustrating a modification of a recording clock generation apparatus according to the first embodiment.

In the above-mentioned embodiment, the PLL circuit for the DVD-R/RW standard is shared by converting the 32T-cycle binarized wobble signal based on the DVD+RW/+R standard into the 186T-cycle binarized wobble signal based on the DVD-R/RW standard, whereby the 32 frequency multiply wobble PLL circuit for the DVD+RW/+R standard can be dispensed with. However, the recording clock generation apparatus may be constructed as shown in FIG. 7. That is, a 186T→32T conversion circuit 701 for converting a 186T-cycle binarized wobble signal based on the DVD-R/RW standard into a 32T-cycle binarized wobble signal based on the DVD+R/+RW standard is provided, a ⅟32 frequency-division circuit 702 and a VCO (32-multiply) 703 are provided as the subsequent PLL circuits, and further, an LPP→ADIP conversion circuit 704 is provided instead of the ADIP→LPP conversion circuit 107 and an ADIP decoder 705 is provided instead of the LPP decoder 116, whereby the PLL circuits for the DVD+R/+R standard are shared, and the 186 frequency multiply wobble PLL circuit for the DVD-R/-RW standard can be dispensed with.

In this case, the phase correction circuit 110 performs phase compensation by correcting a timing error in the recorded data with respect to the ADIP signal, which is caused by that the cycle of the ADIP signal is converted.

Further, sync data, 0 data, and 1 data are included as address data 120 outputted from the ADIP decoder 705.

APPLICABILITY IN INDUSTRY

A recording clock generation apparatus according to the present invention is useful for such as a system LSI for a DVD-R/RW and +RW/+R recording drive for PCs, having a DVD-R/RW and +RW/+R recorder. Further, it is also applicable to such as a system LSI for a DVD-R/RW and +RW/+R recorder for consumer use.

The invention claimed is:

1. A recording clock generation apparatus for generating a recording clock to be used when performing recording on plural recording media based on DVD+RW/+R and DVD-R/RW standards of frequencies at recording, using the same recorder, said apparatus comprising: a frequency conversion circuit for converting an inputted 32T-cycle binarized wobble signal based on a DVD+RW/+R standard into a 186T-cycle binarized wobble signal based on a DVD-R/RW standard; a selector for selecting, as a selected 186T-cycle binarized wobble signal, either the converted 186T-cycle binarized wobble signal that is outputted from the frequency conversion circuit or the inputted or an inputted 186T-cycle binarized wobble signal, and outputting the selected 186T-cycle binarized wobble signal; and a PLL circuit for 186-multiplying the frequency of the selected 186T-cycle binarized wobble signal of outputted from the selector for generating said recording clock.

2. A recording clock generation apparatus as defined in claim 1 further including a physical address data decoder comprising a circuit for converting a binarized ADIP signal based on the DVD+RW/+R standard into a binarized land pre-pit signal based on the DVD-R/RW standard, and a circuit for detecting even sync data, odd sync data, 0 data, and 1 data from the binarized land pre-pit signal.

3. A recording clock generation apparatus as defined in claim 1 further including:
   a circuit for converting a binarized ADIP signal based on the DVD+RW/+R standard into a binarized land pre-pit signal based on the DVD-R/RW standard; and
   a phase adjustment circuit for performing phase adjustment between the selected 186T-cycle binarized wobble signal and the binarized land pre-pit signal which are based on the DVD-R/RW standard.

4. A recording clock generation apparatus for generating a recording clock to be used when performing recording on plural recording media based on DVD+RW/+R and DVD-R/RW standards of frequencies at recording, using the same recorder, said apparatus comprising: a frequency conversion circuit for converting an inputted 186T-cycle binarized wobble signal based on a DVD-R/RW standard into a 32T-cycle binarized wobble signal based on a DVD+RW/+R standard; a selector for selecting, as a selected 32T-cycle binarized wobble signal, either the converted 32T-cycle binarized wobble signal that is outputted from the frequency conversion circuit or an inputted 32T-cycle binarized wobble signal, and outputting the selected 32T-cycle binarized wobble signal; and a PLL circuit for 32-multiplying the frequency of the selected 32T-cycle binarized wobble signal of outputted from the selector for generating said recording clock.

5. A recording clock generation apparatus as defined in claim 4 further including a physical address data decoder comprising a circuit for converting a binarized land pre-pit signal based on the DVD-R/RW standard into a binarized ADIP signal based on the DVD+RW/+R standard, and a circuit for detecting sync data, 0 data, and 1 data from the binarized ADIP signal.

6. A recording clock generation apparatus as defined in claim 4 further including:
   a circuit for converting a binarized land pre-pit signal based on the DVD-R/RW standard into a binarized ADIP signal based on the DVD+RW/+R standard; and
   a phase adjustment circuit for performing phase adjustment between the selected 32T-cycle binarized wobble signal and the binarized ADIP signal which are based on the DVD+RW/+R standard.

7. A recording clock generation apparatus for generating a recording clock to be used when performing recording on plural recording media based on optical disc standards of frequencies at recording, using the same recorder, said apparatus comprising:
   a frequency conversion circuit for converting an inputted first cycle binarized wobble signal based on a first optical disc standard into a second cycle binarized wobble signal based on a second optical disc standard;
   a selector for selecting, as a selected second cycle binarized wobble signal, either the second cycle binarized wobble signal that is outputted from the frequency conversion circuit or an inputted second cycle binarized wobble signal, and outputting the selected second cycle binarized wobble signal; and
   a PLL circuit for multiplying the frequency of the selected second cycle binarized wobble signal outputted from the selector to change its cycle from the wobble cycle to the cycle of the recording clock.

* * * * *